(12) United States Patent
Pei (10) Patent No.: US 8,388,753 B2
(45) Date of Patent: Mar. 5, 2013

(54) COATING APPARATUS

(75) Inventor: Shao-Kai Pei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 516 days.

(21) Appl. No.: 12/790,853

(22) Filed: May 31, 2010

(65) Prior Publication Data

US 2011/0126766 A1  Jun. 2, 2011

(30) Foreign Application Priority Data

Nov. 30, 2009  (CN) .......................... 2009 1 0310691

(51) Int. Cl.
 *C23C 14/00* (2006.01)
 *C23C 16/00* (2006.01)
 *C23F 1/00* (2006.01)

(52) U.S. Cl. ... 118/719; 118/715; 118/728; 156/345.33; 204/298.07; 204/298.09; 204/298.11; 204/298.15; 204/298.21; 204/298.22; 204/298.23; 204/298.26

(58) Field of Classification Search .................. 118/715, 118/719, 728; 156/345.33; 204/298.07, 204/298.09, 298.11, 298.15, 298.21, 298.22, 204/298.23, 298.26
See application file for complete search history.

(56) References Cited

U.S. PATENT DOCUMENTS

| | | | | |
|---|---|---|---|---|
| 3,856,654 A | * | 12/1974 | George | 204/298.07 |
| 4,268,374 A | * | 5/1981 | Lepselter | 204/298.31 |
| 4,615,294 A | * | 10/1986 | Scapple et al. | 118/50.1 |
| 6,747,249 B2 | * | 6/2004 | Robinson et al. | 219/389 |

* cited by examiner

*Primary Examiner* — Rakesh Dhingra
*Assistant Examiner* — Benjamin Kendall
(74) *Attorney, Agent, or Firm* — Altis Law Group, Inc.

(57) ABSTRACT

A coating apparatus includes a deposition case, a reaction assembly, two precursors, a target, and a driving assembly. The deposition case includes a housing defining a cavity for receiving workpieces. The reaction assembly receives in the cavity and includes an outer barrel, an inner barrel, a plurality of nozzles, and a plurality of pipes. The outer barrel includes a main body and two protruding bodies. The main body and the inner barrel cooperatively define a first room therebetween. Each protruding body defines a second room communicating with the first room. The inner barrel defines a third room. The nozzles extend from the main body and communicate with the first room. The pipes extend from the inner barrel and communicate with the third room. The precursors receive in the second rooms. The target receives in the third room. The driving assembly drives the housing to rotate relative to the reaction assembly.

20 Claims, 6 Drawing Sheets

FIG. 6

COATING APPARATUS

BACKGROUND

1. Technical Field

The present disclosure relates to coating technologies and, particularly, to a coating apparatus.

2. Description of Related Art

Different kinds of coating technologies, such as sputter-coating processes or chemical vapor deposition (CVD) processes, are widely used for coating workpieces. Generally, a sputter-coating apparatus is used for a sputter-coating process, and a CVD apparatus is used for a CVD process. However, if two coatings need to be deposited on the same workpieces by the two processes, the workpieces need to be moved from the sputter-coating apparatus to the CVD apparatus. This is inconvenient and can cause the workpieces to be contaminated.

Therefore, what is needed is to provide a coating apparatus, which can overcome the above-mentioned problems.

DETAILED DESCRIPTION

Referring to FIGS. 1-4, a coating apparatus 100 for forming coatings on a plurality of workpieces (not shown), according to a first exemplary embodiment, includes a deposition case 10, a driving assembly 20, a reaction assembly 30, a target 40, two precursors 50, a power supplying unit 60, and a controller 70.

Figure 1:
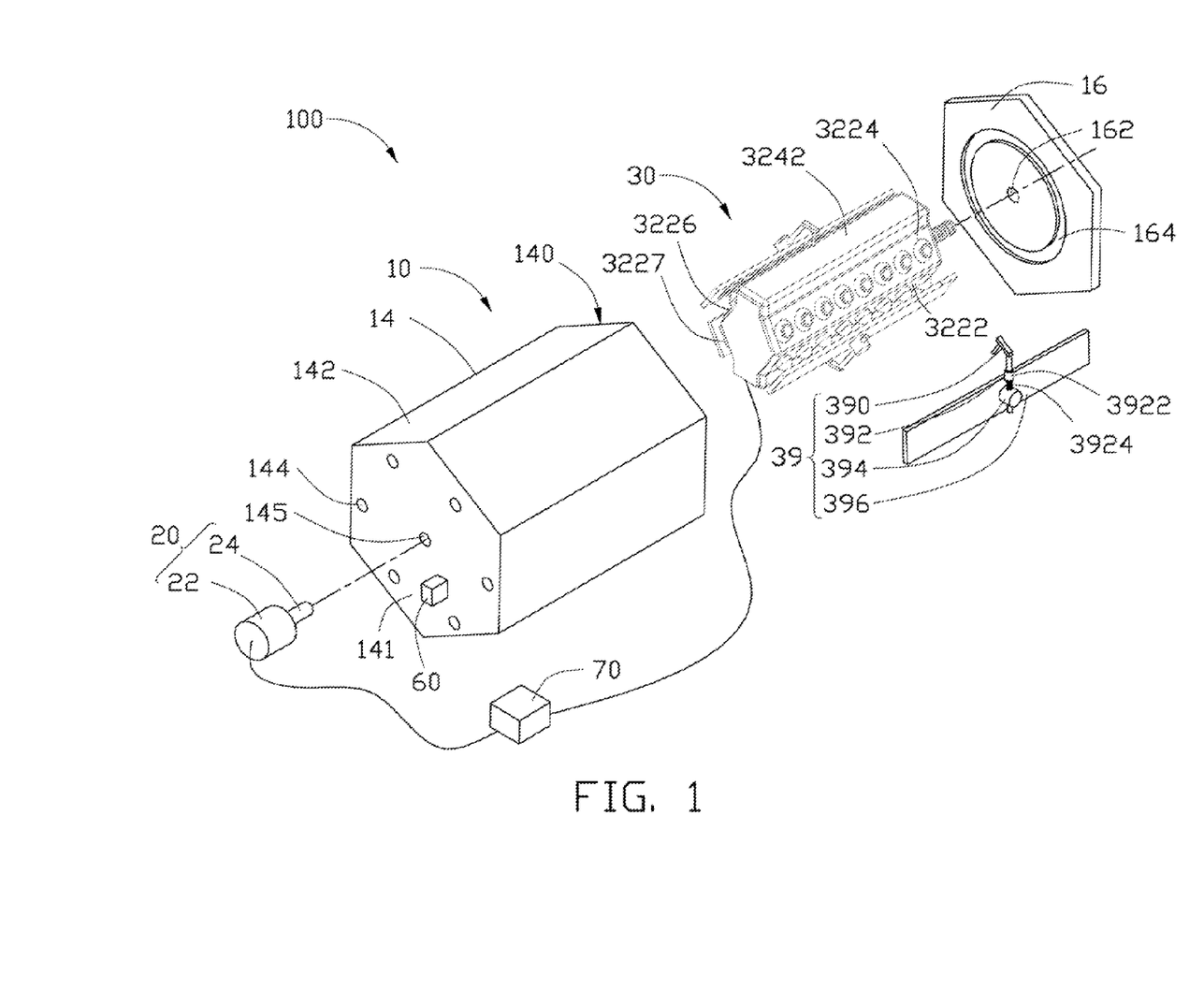
FIG. 1 is an exploded, isometric view of a coating apparatus including a deposition case and a reaction assembly, according to a first exemplary embodiment.
Figure 2:
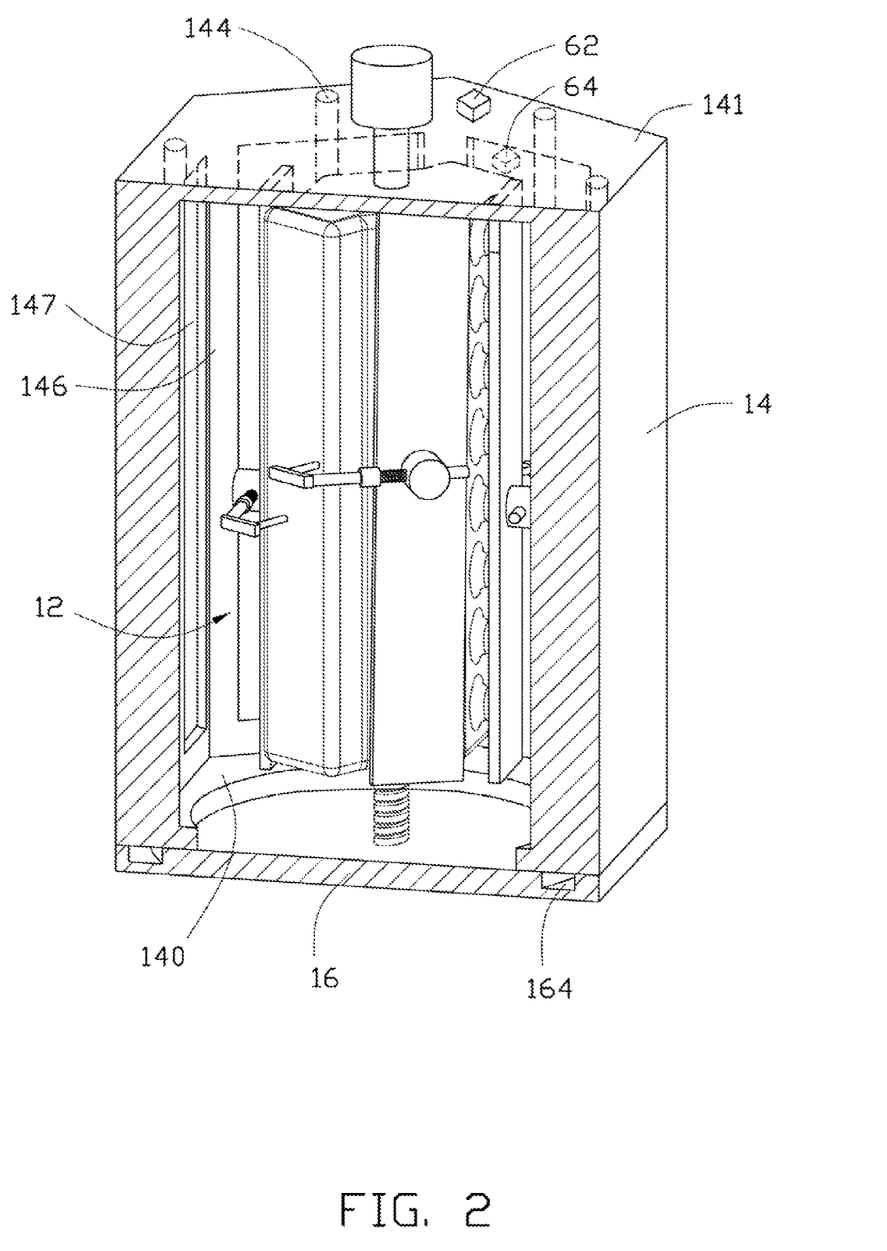
FIG. 2 is a sectional view of the coating apparatus of FIG. 1.
Figure 3:
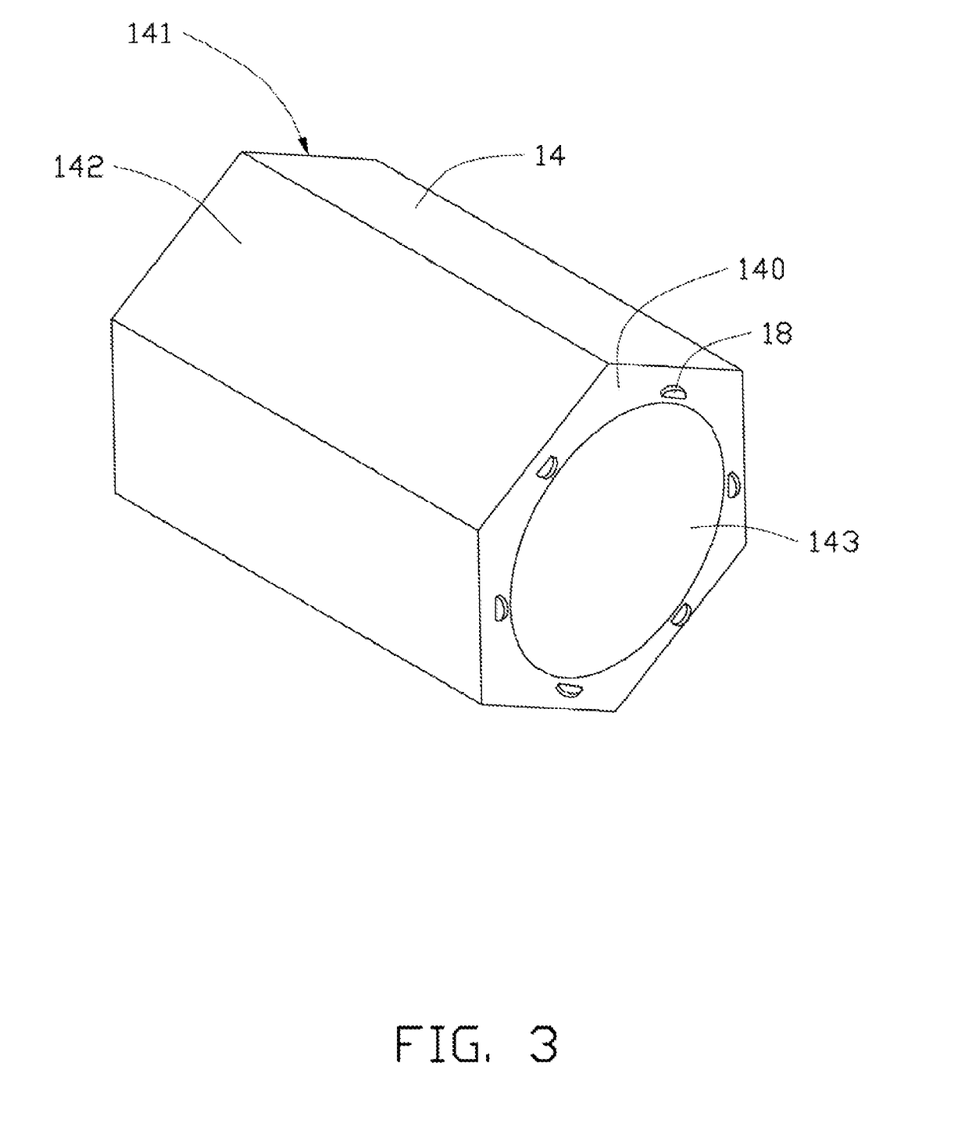
FIG. 3 is a schematic, isometric view of the deposition case of FIG. 1.

The deposition case 10 may be made of metal and defines a cavity 12. The deposition case 10 includes a housing 14, a base 16, and six wheels 18.

The housing 14 has a hexagonal cross-section. The housing 14 includes a bottom panel 140, a top panel 141 opposite to the bottom panel 140, and six sidewalls 142 connecting the top panel 141 to the bottom panel 140. The bottom panel 140 defines a first through hole 143. The first through hole 143 is in communication with the cavity 12. The top panel 141 defines six gas outlets 144 and a fixing hole 145. The fixing hole 145 is positioned substantially at a center of the top panel 141. The six gas outlets 144 are substantially equidistantly spaced from each other around the fixing hole 145 and correspond to the respective sidewalls 142. An inner surface 146 of each sidewall 142 defines a receiving groove 147. Each receiving groove 147 communicates with a corresponding gas outlet 144. A vacuum pump (not shown) outside the cavity 12 is connected to the six gas outlets 144. The vacuum pump is configured to hold the workpieces in the receiving grooves 147 by providing a sucking force through the gas outlets 144 to the workpieces.

The base 16 has a hexagonal section-cross connected to the bottom panel 140. The base 16 defines a threaded hole 162 and an annular guiding groove 164. The threaded hole 162 is positioned substantially at a center of the base 16. The guiding groove 164 surrounds the threaded hole 162.

The six wheels 18 are fixed to the bottom panel 140 surrounding the first through hole 143 (see FIG. 3). The six wheels 18 are received in the guiding groove 164 when the base 16 is mounted to the housing 14.

The driving assembly 20 is a servomotor and includes a first stator 22 and a first rotor 24 extending from the first stator 22. The first stator 22 is fixed outside the deposition case 10. The first rotor 24 engages with the fixing hole 145 so that the driving assembly 20 is connected to the housing 14. The housing 14 rotates relative to the base 16 with the rotation of the first rotor 24. The six wheels 18 roll in the guiding groove 164 with the rotation of the housing 14. In this embodiment, a gap may be formed between the housing 14 and the base 16. A sealing ring (not shown) may be applied to seal the gap so that the cavity 12 is airproof.

Referring to FIGS. 1-2 and 4-5, the reaction assembly 30 is received in the cavity 12 of the deposition case 10. The reaction assembly 30 is coaxial with the housing 14. The reaction assembly 30 includes an outer barrel 32, an inner barrel 34, a threaded pole 36, a plurality of nozzles 37, a plurality of pipes 38, and four shielding members 39. The outer barrel 32 and the inner barrel 34 cooperatively define a first room 3220 therebetween.

Figure 4:
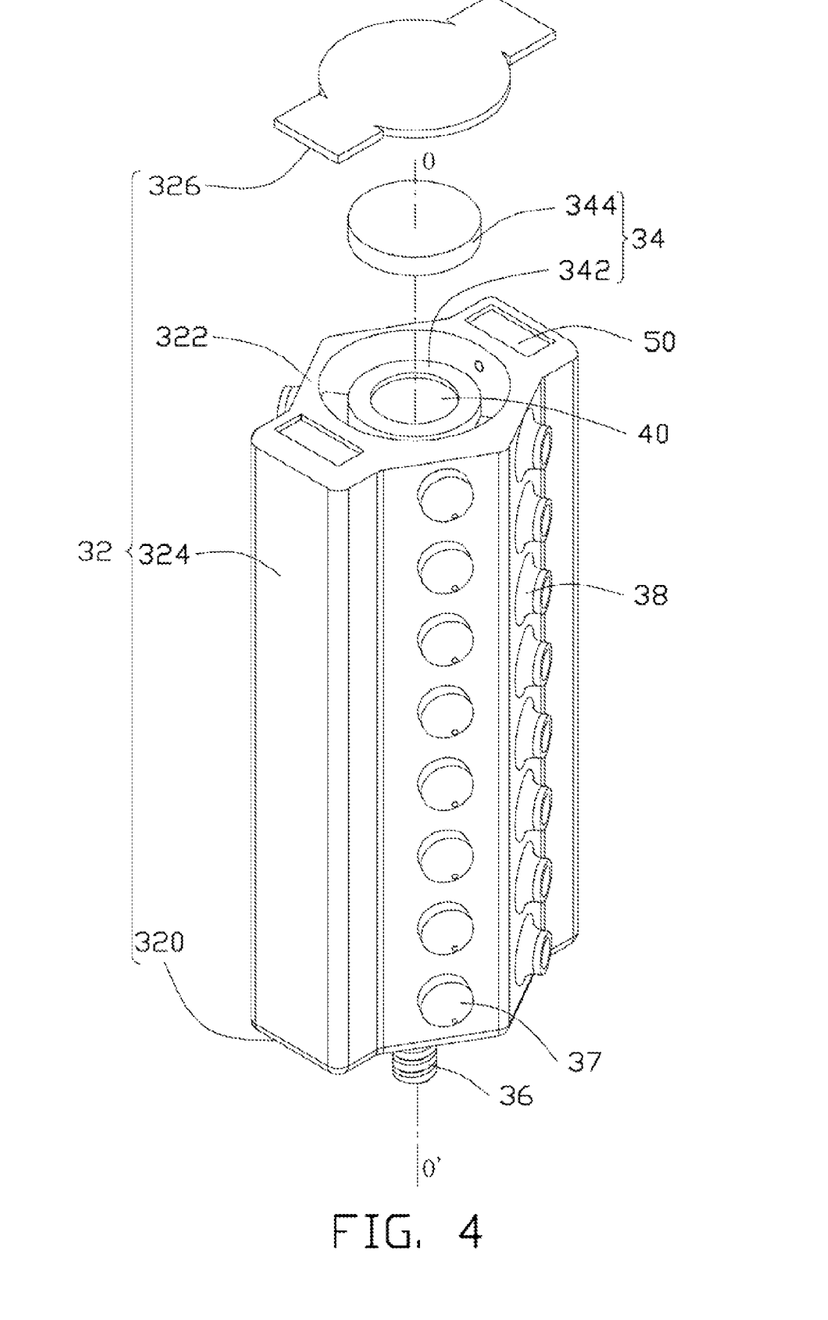
FIG. 4 is a schematic, isometric view of the reaction assembly of FIG. 1.
Figure 5:
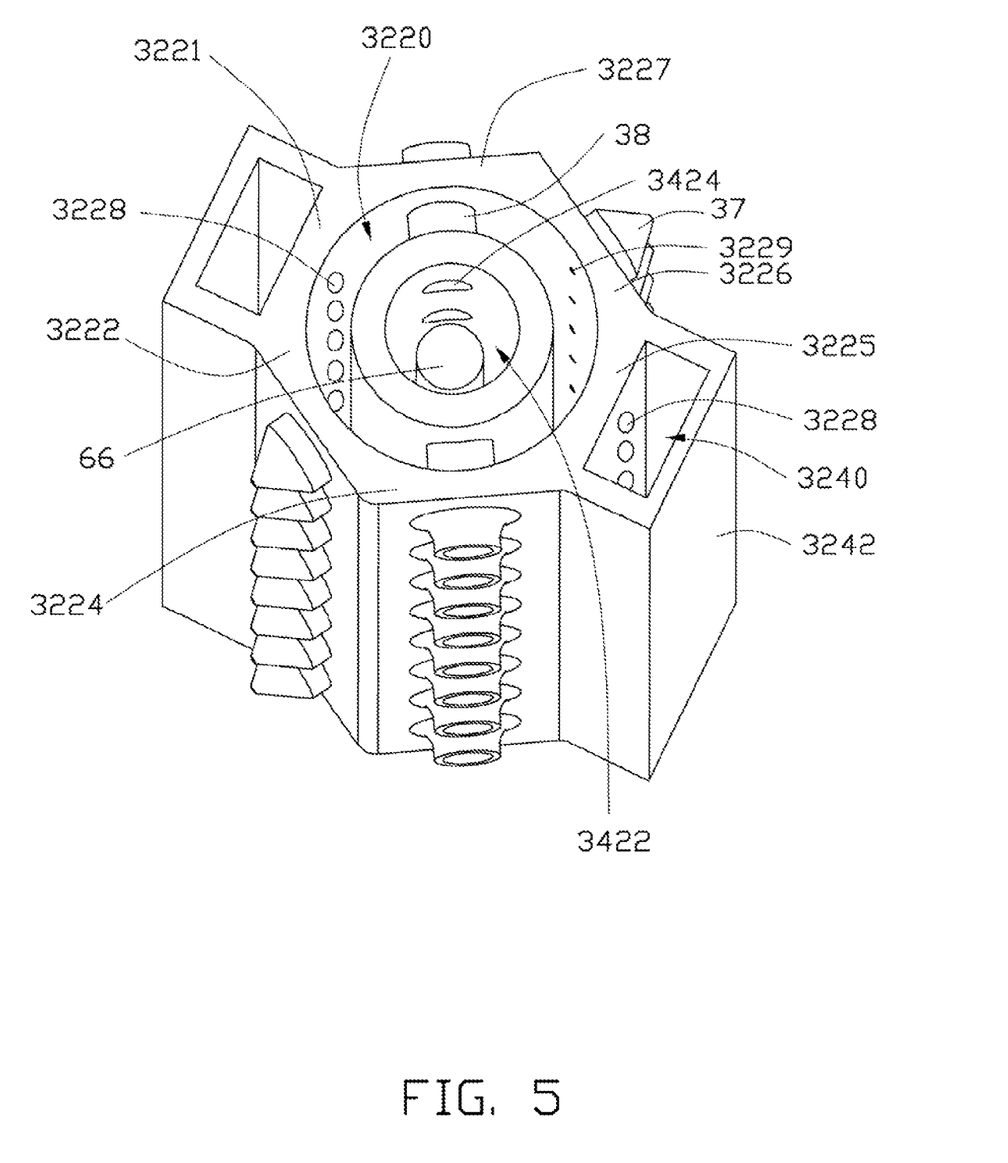
FIG. 5 is similar to FIG. 4, but viewing the reaction assembly from another angle.

The outer barrel 32 includes a bottom plate 320, a main body 322 extending from the bottom plate 320, two protruding bodies 324 extending from the bottom plate 320, and an outer cover 326.

The main body 322 is substantially a hollow hexagonal prism and includes a first sidewall 3221, a second sidewall 3222, a third sidewall 3224, a fourth sidewall 3225, a fifth sidewall 3226, and a sixth sidewall 3227 connected to each other end to end. The first sidewall 3221 is approximately parallel to the fourth sidewall 3225. The second sidewall 3222 is approximately parallel to the fifth sidewall 3226. The third sidewall 3224 is approximately parallel to the sixth sidewall 3227.

The first sidewall 3221 and the fourth sidewall 3225 define a plurality of second through holes 3228. The second sidewall 3222 and the fifth sidewall 3226 define a plurality of third through holes 3229 corresponding to the plurality of nozzles 37.

The protruding bodies 324 extend from the first sidewall 3221 and the fourth sidewall 3225, respectively. Each protruding body 324 is substantially a cuboid and defines a second room 3240. Each protruding body 324 includes an outer surface 3242. The second through holes 3228 communicates with the second room 3240.

The outer cover 326 covers the main body 322 and the protruding bodies 324. The outer cover 326 seals the first room 3220 and the second rooms 3240.

The inner barrel 34 includes a hollow cylinder body 342 and an inner cover 344. The cylinder body 342 defines a third room 3422. The cylinder body 342 further defines a plurality of fourth through holes 3424 communicating with the third room 3422. The fourth through holes 3424 are arranged in two lines along a central axis OO' of the housing 14, respectively corresponding to the third sidewall 3224 and the sixth sidewall 3227. The inner cover 344 covers the cylinder body 342 and seals the third room 3422.

The threaded pole 36 extends from the bottom plate 320 away from the outer barrel 32 and the inner barrel 34. The threaded pole 36 engages with the threaded hole 162 so that the reaction assembly 30 is fixedly connected to the base 16.

The nozzles 37 are arranged in two lines along the central axis OO'. A line of nozzles 37 are fixed to the second sidewall 3222 outside the first room 3220, and the other line of nozzles 37 are fixed to the fifth sidewall 3226 outside the first room 3220. Each nozzle 37 corresponds to a third through hole 3229.

The pipes 38 are arranged in two lines along the central axis OO'. A line of pipes 38 extend from the third sidewall 3224 and are mounted to a line of fourth through holes 3424, the other line of pipes 38 extend from the sixth sidewall 3227 and are mounted to the other line of fourth though holes 3424. As a result, the pipes 38 communicate with the third room 3422.

Each shielding member 39 includes a connecting rod 390, an actuator 392, a lead cap 394, and a shielding plate 396.

The connecting rod 390 is fixedly connected to the outer surface 3242 and is bent toward the third sidewall 3224. The actuator 392 includes a second stator 3922 and a second rotor 3924 extending from the second stator 3922. The second stator 3922 is fixedly connected to the connecting rod 390. The second rotor 3924 is a lead screw. The lead cap 394 is fixed on the shielding plate 396. The shielding plate 396 faces the third sidewall 3224 and covers a line of pipes 38. The second rotor 3924 threadedly engages with the screw cap 394. The screw cap 394 moves along the second rotor 3924 with the rotation of the second rotor 3924. The shielding plate 396 moves with the movement of the screw cap 394 to cover or open the pipes 38. In this embodiment, one outer surface 3242 has two shielding members 39 mounted thereon, with one shielding plate 396 substantially parallel to the third sidewall 3224, and the other shielding member 39 substantially parallel to the fifth sidewall 3226. The other outer surface 3242 has another two shielding members 39 mounted thereon, with one shielding plate 396 substantially parallel to the second sidewall 3222, and the other shielding plate 396 substantially parallel to the sixth sidewall 3227.

The target 40 is fixedly received in the third room 3422. The two precursors 50 are fixedly received in the second rooms 3240, respectively.

The power supplying unit 60 includes a power source 62, a cathode 64, an anode 66, and two heaters (not shown). The power source 62 may be fixedly positioned on the top panel 141 outside the deposition case 10. The cathode 64, the anode 66, and the heaters are received in the cavity 12. In particular, the cathode 64 is fixed to the top panel 141. The anode 66 is fixed to the bottom plate 320 and is received in the third room 3422 below the target 40. The heaters are fixed in the second rooms 3240 below the precursor 50, respectively. The precursors 50 are heated by the heaters and vaporized to be a first reaction gas. The power source 62 is electrically connected to the cathode 64, the anode 66, and the two heaters.

The controller 70 is electrically connected to the vacuum pump, the driving assembly 20, the actuator 392, the heaters and the pipes 38. The controller 70 is configured for controlling the vacuum pump to evacuate the receiving grooves 147, controlling the driving assembly 20 to drive the first rotor 24 to rotate, controlling the actuator 392 to drive the second rotor 3924 to rotate, controlling the heaters to heat the precursors 50, and controlling one line of the pipes 38 to introduce an inert gas into the third room 3422.

During sputter-coating of the workpieces, two shielding plates 396 cover the two lines of nozzles 37, and the other two shielding plates 396 open the two lines of the pipes 38. A desirable voltage is produced between the cathode 64 and the anode 66. An inert gas is introduced into the third room 3422 through one line of the pipes 38 and is excited to release energized ions by the desirable voltage. The energized ions bombard the target 40 to vaporize the target 40. The vaporized target 40 passes through the other line of the pipes 38 and is then deposited on the workpieces.

During a chemical vapor deposition for coating the workpieces, two shielding plates 396 cover the two lines of the pipes, and the other two shielding plates 396 open the two lines of the nozzles 37. The precursors 50 are heated and vaporized by the heaters to be a first reaction gas. The first reaction gas passes through the second through holes 3228 and enters into the first room 3220. A second reaction gas is introduced into the first room 3220 to react with the first reaction gas. The resultant of reaction is sprayed through the two lines of the nozzles 37 and then deposited on the workpieces.

The sputter-coating process and the chemical vapor deposition process can be applied in the coating apparatus 100 in turn. This is convenient and makes the workpieces clear. Further, during both of the sputter-coating process and the chemical vapor deposition process, the driving assembly 20 drives the first rotor 24 to rotate, the housing 14 rotates relative to the base 16 with the rotation of the first rotor 24. As a result, the coatings on the workpieces are uniform.

Figure 6:
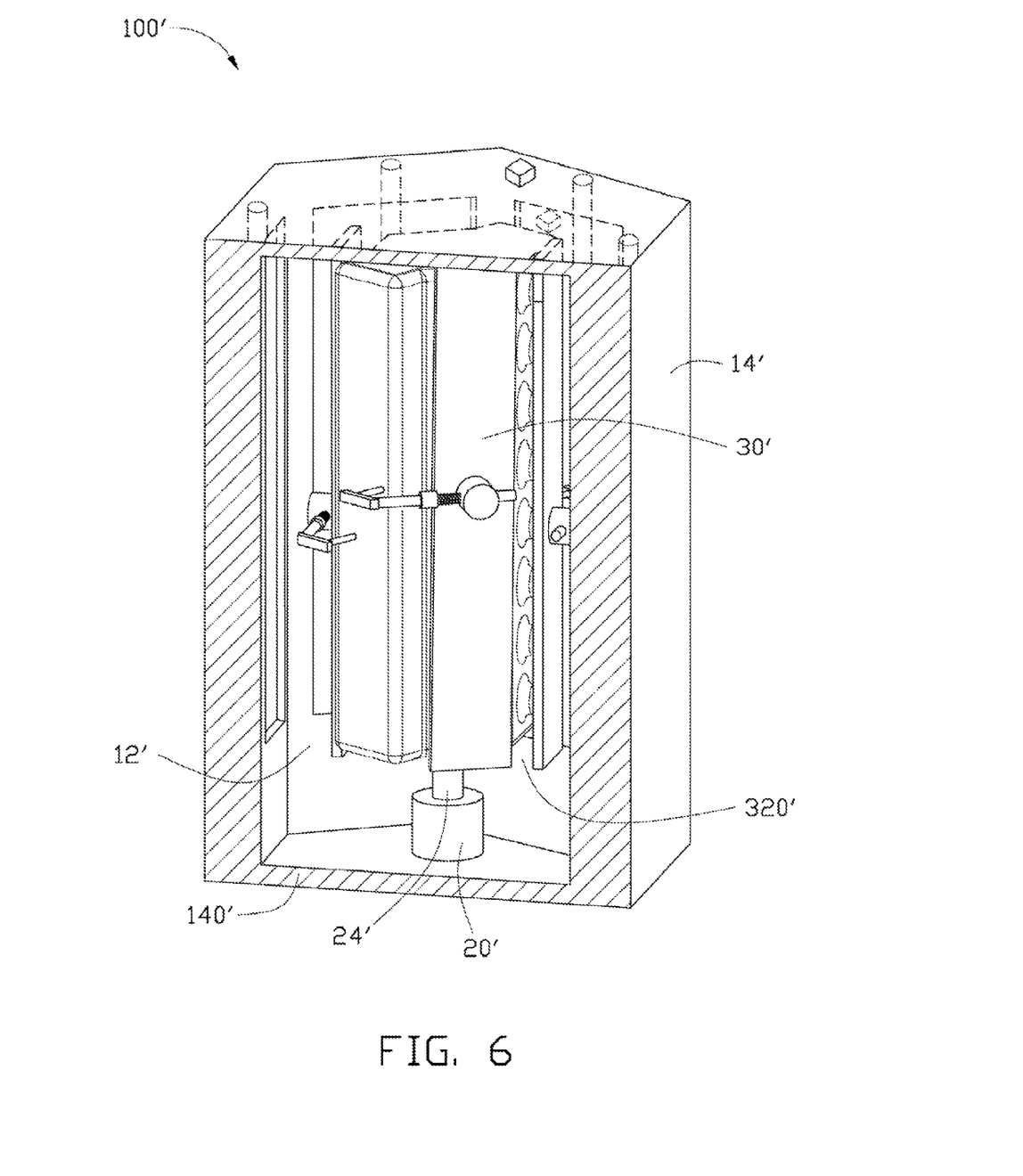
FIG. 6 is a sectional view of a coating apparatus, according to a second exemplary embodiment.

Referring to FIGS. 2 and 6, a coating apparatus 100', according to a second exemplary embodiment, is shown. The differences between the coating apparatus 100' of this embodiment and the coating apparatus 100 of the first exemplary embodiment are the following: the base 16, and the wheels 18 are omitted, the threaded pole 36 is omitted, and the fixing hole 145 and the first through hole 143 are omitted, and the bottom panel 140' seals the cavity 12'. The driving assembly 20' is fixed on the bottom panel 140' and received in the cavity 12'. The first rotor 24' engages with a threaded hole defined on the bottom plate 320' so that the reaction assembly 30' is connected to the first rotor 24'. The controller (not shown) is configured for controlling the driving assembly 20' to drive the first rotor 24'. The reaction assembly 30 rotates relative to the housing 14' with the rotation of the first rotor 24'.

Advantages of the second embodiment are similar to those of the first embodiment.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A coating apparatus for coating a plurality of workpieces, comprising:
    a deposition case comprising a housing and a cavity for receiving the workpieces therein;
    a reaction assembly received in the cavity and being coaxial with the deposition case, the reaction assembly comprising an outer barrel, an inner barrel, a plurality of nozzles, and a plurality of pipes; the outer barrel comprising a main body and two protruding bodies extending from the main body, the main body and the inner barrel cooperatively defining a first room therebetween, each protruding body defining a second room, the inner barrel defining a third room therein; the second room communicating with the first room, the nozzles extending from the main body and communicating with the first room, the pipes extending from the inner barrel and communicating with the third room;
two precursors received in the respective second rooms;
a target received in the third room; and
a driving assembly for driving the housing to rotate relative to the reaction assembly.

2. The coating apparatus as claimed in claim 1, wherein the housing has a hexagonal cross-section and includes a bottom panel, a top panel opposite to the bottom panel, and six sidewalls connecting the top panel to the bottom panel.

3. The coating apparatus as claimed in claim 2, wherein the top panel defines a fixing hole, the driving assembly comprises a first stator and a first rotor extending from the first stator, the first stator is fixed outside the deposition case, the first rotor engages with the fixing hole so that the driving assembly is connected to the housing.

4. The coating apparatus as claimed in claim 3, wherein the coating apparatus further comprises a vacuum pump, the top panel further defines six gas outlets connected to the vacuum pump, the fixing hole is positioned substantially at a center of the top panel, the six gas outlets are substantially equidistantly spaced from each other around the fixing hole and spatially correspond to the respective sidewalls, an inner surface of each sidewall defines a receiving groove, each receiving groove communicates with a gas outlet, the vacuum pump configured to hold the workpieces in the receiving grooves by providing a sucking force through the gas outlets to the workpieces.

5. The coating apparatus as claimed in claim 4, wherein the reaction assembly further comprises a threaded pole, the bottom panel defines a first through hole communicating with the cavity, the deposition case further comprises a base and six wheels, connected to the bottom panel, the base defines a threaded hole and an annular guiding groove, the threaded hole is positioned substantially at a center of the base, the guiding groove surrounds the threaded hole, the six wheels are fixed to the bottom panel surrounding the first through hole, the six wheels received in the guiding groove, the threaded pole passes through the first through hole and engages with the threaded hole so that the reaction assembly is connected to the base.

6. The coating apparatus as claimed in claim 5, wherein the outer barrel comprises a bottom plate, the main body and the protruding bodies extend from the bottom plate, the main body includes a first sidewall, a second sidewall, a third sidewall, a fourth sidewall, a fifth sidewall, and a sixth sidewall connected to each other end to end, the first sidewall is approximately parallel to the fourth sidewall, the second sidewall is approximately parallel to the fifth sidewall, the third sidewall is approximately parallel to the sixth sidewall, the protruding bodies extend from the first sidewall and the fourth sidewall.

7. The coating apparatus as claimed in claim 6, wherein the first sidewall and the fourth sidewall define a plurality of second through holes, the second sidewall and the fifth sidewall define a plurality of third through holes, the second room communicates the first room through the second through holes, the nozzles spatially correspond to the respective third through holes.

8. The coating apparatus as claimed in claim 7, wherein the outer barrel further comprises an outer cover, the outer cover covers the main body and the protruding bodies, the outer cover seals the first room and the second room.

9. The coating apparatus as claimed in claim 8, wherein the inner barrel comprises a hollow cylinder body and an inner cover, the cylinder body defines the third room, the cylinder body further defines a plurality of fourth through holes communicating with the third room, the fourth through holes arranged in two lines, respectively corresponding to the third sidewall and the sixth sidewall, and the inner cover covers the cylinder body and seals the third room.

10. The coating apparatus as claimed in claim 9, wherein the pipes includes first pipes and second pipes, the first pipes arranged along a first line and extending from the third sidewall toward and terminating at the corresponding fourth through holes, the second pipes arranged along a second line and extending from the sixth sidewall toward and terminating at the corresponding fourth though holes.

11. The coating apparatus as claimed in claim 10, wherein the reaction assembly further comprises four shielding members, each shielding member comprises a connecting rod, an actuator, a lead cap, and a shielding plate, the connecting rod is fixedly connected to an outer surface of the protruding body and is bent toward the third sidewall, the actuator comprises a second stator and a second rotor extending from the second stator, the second stator is fixedly connected to the connecting rod, the second rotor is a lead screw, the lead cap is fixed on the shielding plate, the shielding plate faces the third sidewall and covers a line of pipes, the second rotor threadedly engages with the screw cap.

12. The coating apparatus as claimed in claim 11, wherein one outer surface has two shielding members mounted thereon, with one shielding plate thereof parallel to the third sidewall, and the other shielding member thereof parallel to the fifth sidewall; the other outer surface has another two shielding members mounted thereon, with one shielding plate thereof parallel to the second sidewall, and the other shielding plate thereof parallel to the sixth sidewall.

13. A coating apparatus for coating a plurality of workpieces, comprising:
a deposition case comprising a housing and a cavity for receiving the workpieces therein;
a reaction assembly received in the cavity and being coaxial with the deposition case, the reaction assembly comprising an outer barrel, an inner barrel, a plurality of nozzles, and a plurality of pipes; the outer barrel comprising a main body and two protruding bodies extending from the main body, the main body and the inner barrel cooperatively defining a first room therebetween, each protruding body defining a second room, the inner barrel defining a third room therein; the second room communicating with the first room, the nozzles extending from the main body and communicating with the first room, the pipes extending from the inner barrel and communicating with the third room;
two precursors received in the corresponding second rooms;
a target received in the third room;
a driving assembly for driving the reaction assembly to rotate relative to the housing.

14. The coating apparatus as claimed in claim 13, wherein the housing has a hexagonal cross-section and includes a bottom panel, a top panel opposite to the bottom panel, and six sidewalls connecting the top panel to the bottom panel.

15. The coating apparatus as claimed in claim 14, wherein the driving assembly comprises a first stator and a first rotor extending from the first stator, the driving assembly is fixed on the bottom panel and received in the cavity, the reaction assembly further defines a thread hole, the first rotor engages with the thread hole so that the reaction assembly is connected to the first rotor.

16. The coating apparatus as claimed in claim 15, wherein the coating apparatus further comprises a vacuum pump, the top panel defines six gas outlets connected to the vacuum pump, the six gas outlets are substantially equidistantly spaced from each other around a center of the top panel and spatially correspond to the respective sidewalls, an inner surface of each sidewall defines a receiving groove, each receiving groove communicates with a gas outlet, the vacuum pump configured to hold the workpieces in the receiving grooves by providing a sucking force through the gas outlets to the workpieces.

17. The coating apparatus as claimed in claim 16, wherein the outer barrel comprises a bottom plate defining the threaded hole, the main body and the protruding bodies extend from the bottom plate, the main body includes a first sidewall, a second sidewall, a third sidewall, a fourth sidewall, a fifth sidewall, and a sixth sidewall connected to each other end to end, the first sidewall is approximately parallel to the fourth sidewall, the second sidewall is approximately parallel to the fifth sidewall, the third sidewall is approximately parallel to the sixth sidewall, the protruding bodies extend from the first sidewall and the fourth sidewall.

18. The coating apparatus as claimed in claim 17 wherein the first sidewall and the fourth sidewall define a plurality of second through holes, the second sidewall and the fifth sidewall define a plurality of third through holes, the second room communicates the first room through the second through holes, the nozzles spatially correspond to the respective third through holes.

19. The coating apparatus as claimed in claim 18, wherein the outer barrel further comprises an outer cover, the outer cover covers the main body and the protruding bodies, the outer cover seals the first room and the second room.

20. The coating apparatus as claimed in claim 19, wherein the inner barrel comprises a hollow cylinder body and an inner cover, the cylinder body defines the third room, the cylinder body further defines a plurality of fourth through holes communicating with the third room, the fourth through holes arranged in two lines, respectively corresponding to the third sidewall and the sixth sidewall, the inner cover covers the cylinder body and seals the third room.

* * * * *